United States Patent
Voisin

(10) Patent No.: US 8,366,434 B2
(45) Date of Patent: Feb. 5, 2013

(54) IMPRINT ALIGNMENT METHOD, SYSTEM AND TEMPLATE

(75) Inventor: Ronald D. Voisin, Fremont, CA (US)

(73) Assignee: Molecular Imprints, Inc., Austin, TX (US)

(*) Notice: Subject to any disclaimer, the term of this patent is extended or adjusted under 35 U.S.C. 154(b) by 280 days.

(21) Appl. No.: 12/835,181

(22) Filed: Jul. 13, 2010

(65) Prior Publication Data

US 2010/0278955 A1   Nov. 4, 2010

Related U.S. Application Data

(63) Continuation of application No. 10/895,214, filed on Jul. 20, 2004, now Pat. No. 7,785,526.

(51) Int. Cl.
  *B29C 35/08* (2006.01)
  *B29C 43/02* (2006.01)
  *B29C 33/00* (2006.01)

(52) U.S. Cl. ......... 425/385; 425/375; 425/396; 425/400

(58) Field of Classification Search .......... 425/375, 425/385, 396, 400; 264/293, 494, 496; 430/22, 430/30; 356/399, 400, 401
See application file for complete search history.

(56) References Cited

U.S. PATENT DOCUMENTS

| | | | | |
|---|---|---|---|---|
| 3,577,593 A | * | 5/1971 | Jackson | 425/388 |
| 3,677,178 A | * | 7/1972 | Gipe | 101/450.1 |
| 3,783,520 A | * | 1/1974 | King | 356/508 |
| 4,070,116 A | * | 1/1978 | Frosch et al. | 356/625 |
| 4,201,800 A | * | 5/1980 | Alcorn et al. | 430/5 |
| 4,202,681 A | * | 5/1980 | McMaster et al. | 65/104 |
| 4,256,829 A | * | 3/1981 | Daniel | 438/542 |
| 4,326,805 A | * | 4/1982 | Feldman et al. | 356/399 |
| 4,356,018 A | * | 10/1982 | McMaster | 65/104 |
| 4,444,801 A | * | 4/1984 | Hongo et al. | 427/10 |
| 4,487,623 A | * | 12/1984 | Claassen et al. | 65/106 |
| 4,512,848 A | * | 4/1985 | Deckman et al. | 216/43 |
| 4,600,309 A | * | 7/1986 | Fay | 356/401 |
| 4,707,611 A | * | 11/1987 | Southwell | 250/559.28 |
| 4,722,878 A | * | 2/1988 | Watakabe et al. | 430/5 |
| 4,724,222 A | * | 2/1988 | Feldman | 250/492.2 |
| 4,731,155 A | * | 3/1988 | Napoli et al. | 216/44 |
| 4,776,695 A | * | 10/1988 | van Pham et al. | 356/328 |
| 4,848,911 A | * | 7/1989 | Uchida et al. | 356/509 |
| 4,865,639 A | * | 9/1989 | Kudo | 65/287 |
| 4,877,437 A | * | 10/1989 | Nitschke | 65/287 |
| 4,887,283 A | * | 12/1989 | Hosono | 378/35 |
| 4,897,228 A | * | 1/1990 | Miwa et al. | 264/478 |
| 4,929,083 A | * | 5/1990 | Brunner | 356/400 |
| 4,959,252 A | * | 9/1990 | Bonnebat et al. | 428/64.7 |
| 4,964,145 A | * | 10/1990 | Maldonado | 378/35 |
| 5,016,691 A | * | 5/1991 | Bernier | 144/144.51 |
| 5,028,366 A | * | 7/1991 | Harakal et al. | 264/51 |
| 5,072,126 A | * | 12/1991 | Progler | 250/548 |
| 5,074,667 A | * | 12/1991 | Miyatake | 356/401 |
| 5,110,514 A | * | 5/1992 | Soane | 264/496 |

(Continued)

OTHER PUBLICATIONS

Advanced Materials, vol. 8, No. 10 (1996), pp. 837-840, Fabrication of Three-Dimensional Micro-Structures: Microtransfer Molding, by Xiao-Mei Zhao, Younan Xia, and George M. Whitesides.*

*Primary Examiner* — Joseph Del Sole
*Assistant Examiner* — Seyed Masoud Malekzadeh
(74) *Attorney, Agent, or Firm* — Cameron A. King

(57) ABSTRACT

Sets of lithographic templates providing improved lithographic alignment are described. The sets include at least two templates. The first template has an array of first geometries and the second template has an array of second geometries. The second geometries correspond to the first geometries and at least one second geometry is intentionally offset from its corresponding first geometry.

6 Claims, 5 Drawing Sheets

U.S. PATENT DOCUMENTS

| | | | | |
|---|---|---|---|---|
| 5,148,036 A * | 9/1992 | Matsugu et al. | 250/548 |
| 5,148,037 A * | 9/1992 | Suda et al. | 250/548 |
| 5,151,754 A * | 9/1992 | Ishibashi et al. | 356/490 |
| 5,155,749 A * | 10/1992 | DiMilia et al. | 378/35 |
| 5,160,402 A * | 11/1992 | Cheng | 216/59 |
| 5,171,490 A * | 12/1992 | Fudim | 264/401 |
| 5,179,863 A * | 1/1993 | Uchida et al. | 73/865.8 |
| 5,204,739 A * | 4/1993 | Domenicali | 348/79 |
| 5,206,983 A * | 5/1993 | Guckel et al. | 29/598 |
| 5,218,193 A * | 6/1993 | Miyatake | 250/201.4 |
| 5,235,400 A * | 8/1993 | Terasawa et al. | 356/237.5 |
| 5,240,550 A * | 8/1993 | Boehnke et al. | 216/24 |
| 5,259,926 A * | 11/1993 | Kuwabara et al. | 216/54 |
| 5,270,222 A * | 12/1993 | Moslehi | 438/7 |
| 5,280,437 A * | 1/1994 | Corliss | 702/94 |
| 5,331,371 A * | 7/1994 | Mori et al. | 355/53 |
| 5,331,407 A * | 7/1994 | Doi et al. | 356/394 |
| 5,335,066 A * | 8/1994 | Yamada et al. | 356/364 |
| 5,348,616 A * | 9/1994 | Hartman et al. | 216/48 |
| 5,355,219 A * | 10/1994 | Araki et al. | 356/490 |
| 5,362,940 A * | 11/1994 | MacDonald et al. | 219/121.68 |
| 5,371,822 A * | 12/1994 | Horwitz et al. | 385/89 |
| 5,386,119 A * | 1/1995 | Ledger | 250/341.8 |
| 5,403,433 A * | 4/1995 | Morrison et al. | 216/60 |
| 5,414,514 A * | 5/1995 | Smith et al. | 356/509 |
| 5,425,848 A * | 6/1995 | Haisma et al. | 216/48 |
| 5,452,090 A * | 9/1995 | Progler et al. | 356/401 |
| 5,477,058 A * | 12/1995 | Sato | 250/548 |
| 5,480,047 A * | 1/1996 | Tanigawa et al. | 430/5 |
| 5,493,401 A * | 2/1996 | Horie et al. | 356/632 |
| 5,504,793 A * | 4/1996 | Chen | 378/34 |
| 5,508,527 A * | 4/1996 | Kuroda et al. | 250/491.1 |
| 5,512,131 A * | 4/1996 | Kumar et al. | 438/738 |
| 5,545,367 A * | 8/1996 | Bae et al. | 264/401 |
| 5,563,684 A * | 10/1996 | Stagaman | 355/72 |
| 5,563,702 A * | 10/1996 | Emery et al. | 356/73 |
| 5,565,114 A * | 10/1996 | Saito et al. | 216/60 |
| 5,601,641 A * | 2/1997 | Stephens | 106/38.25 |
| 5,625,193 A * | 4/1997 | Broude et al. | 250/372 |
| 5,633,505 A * | 5/1997 | Chung et al. | 250/491.1 |
| 5,669,303 A * | 9/1997 | Maracas et al. | 101/327 |
| 5,686,993 A * | 11/1997 | Kokubo et al. | 356/630 |
| 5,694,207 A * | 12/1997 | Hung et al. | 356/72 |
| 5,719,495 A * | 2/1998 | Moslehi | 356/630 |
| 5,724,145 A * | 3/1998 | Kondo et al. | 356/632 |
| 5,726,548 A * | 3/1998 | Chiba et al. | 318/625 |
| 5,737,064 A * | 4/1998 | Inoue et al. | 355/73 |
| 5,740,699 A * | 4/1998 | Ballantyne et al. | 74/490.06 |
| 5,772,905 A * | 6/1998 | Chou | 216/44 |
| 5,774,574 A * | 6/1998 | Hoki | 382/149 |
| 5,776,748 A * | 7/1998 | Singhvi et al. | 435/180 |
| 5,785,918 A * | 7/1998 | Hull | 264/401 |
| 5,802,914 A * | 9/1998 | Fassler et al. | 74/110 |
| 5,804,017 A * | 9/1998 | Hector | 156/242 |
| 5,808,742 A * | 9/1998 | Everett et al. | 356/509 |
| 5,812,629 A * | 9/1998 | Clauser | 378/62 |
| 5,817,376 A * | 10/1998 | Everaerts et al. | 427/483 |
| 5,820,769 A * | 10/1998 | Chou | 216/22 |
| 5,837,892 A * | 11/1998 | Cavallaro et al. | 73/149 |
| 5,849,209 A * | 12/1998 | Kindt-Larsen et al. | 249/134 |
| 5,849,222 A * | 12/1998 | Jen et al. | 264/2.3 |
| 5,853,446 A * | 12/1998 | Carre et al. | 65/17.3 |
| 5,858,580 A * | 1/1999 | Wang et al. | 430/5 |
| 5,876,550 A * | 3/1999 | Feygin et al. | 156/264 |
| 5,877,032 A * | 3/1999 | Guinn et al. | 438/9 |
| 5,877,036 A * | 3/1999 | Kawai | 438/16 |
| 5,877,861 A * | 3/1999 | Ausschnitt et al. | 356/401 |
| 5,885,472 A * | 3/1999 | Miyazaki et al. | 216/60 |
| 5,885,514 A * | 3/1999 | Tensor | 264/478 |
| 5,888,650 A * | 3/1999 | Calhoun et al. | 428/354 |
| 5,937,758 A * | 8/1999 | Maracas et al. | 101/327 |
| 5,948,470 A * | 9/1999 | Harrison et al. | 427/198 |
| 5,952,127 A * | 9/1999 | Yamanaka | 430/5 |
| 5,956,216 A * | 9/1999 | Chou | 360/131 |
| 5,974,150 A * | 10/1999 | Kaish et al. | 713/179 |
| 5,999,245 A * | 12/1999 | Suzuki | 355/53 |
| 6,016,696 A * | 1/2000 | Bair et al. | 73/149 |
| 6,019,166 A * | 2/2000 | Viswanath et al. | 165/80.4 |
| 6,032,549 A * | 3/2000 | Tokio et al. | 74/128 |
| 6,038,280 A * | 3/2000 | Rossiger et al. | 378/50 |
| 6,046,056 A * | 4/2000 | Parce et al. | 506/39 |
| 6,049,373 A * | 4/2000 | Miyatake | 355/53 |
| 6,051,179 A * | 4/2000 | Hagenau | 264/401 |
| 6,051,345 A * | 4/2000 | Huang | 430/5 |
| 6,052,183 A * | 4/2000 | Lee | 356/337 |
| 6,068,783 A * | 5/2000 | Szetsen | 216/60 |
| 6,074,827 A * | 6/2000 | Nelson et al. | 435/6.12 |
| 6,081,334 A * | 6/2000 | Grimbergen et al. | 356/499 |
| 6,088,103 A * | 7/2000 | Everett et al. | 356/503 |
| 6,091,485 A * | 7/2000 | Li et al. | 356/73 |
| 6,112,588 A * | 9/2000 | Cavallaro et al. | 73/149 |
| 6,117,708 A * | 9/2000 | Wensel | 438/118 |
| 6,128,085 A * | 10/2000 | Buermann et al. | 356/369 |
| 6,133,576 A * | 10/2000 | Shafer et al. | 250/461.1 |
| 6,137,562 A * | 10/2000 | Masuyuki et al. | 355/73 |
| 6,150,231 A * | 11/2000 | Muller et al. | 438/401 |
| 6,153,886 A * | 11/2000 | Hagiwara et al. | 250/548 |
| 6,165,911 A * | 12/2000 | Calveley | 438/754 |
| 6,190,929 B1* | 2/2001 | Wang et al. | 438/20 |
| 6,204,922 B1* | 3/2001 | Chalmers | 356/630 |
| 6,218,316 B1* | 4/2001 | Marsh | 438/780 |
| 6,245,581 B1* | 6/2001 | Bonser et al. | 438/8 |
| 6,251,207 B1* | 6/2001 | Schultz et al. | 156/209 |
| 6,261,469 B1* | 7/2001 | Zakhidov et al. | 216/56 |
| 6,274,294 B1* | 8/2001 | Hines | 430/322 |
| 6,278,519 B1* | 8/2001 | Rosencwaig et al. | 356/369 |
| 6,278,809 B1* | 8/2001 | Johnson et al. | 385/12 |
| 6,285,439 B1* | 9/2001 | Miyatake | 355/53 |
| 6,295,120 B1* | 9/2001 | Miyatake | 355/53 |
| 6,297,880 B1* | 10/2001 | Rosencwaig et al. | 356/369 |
| 6,304,326 B1* | 10/2001 | Aspnes et al. | 356/369 |
| 6,305,925 B1* | 10/2001 | Cassani | 425/405.1 |
| 6,309,580 B1* | 10/2001 | Chou | 264/338 |
| 6,309,957 B1* | 10/2001 | Tu et al. | 438/622 |
| 6,316,290 B1* | 11/2001 | Wensel | 438/118 |
| 6,326,627 B1* | 12/2001 | Putvinski et al. | 250/423 R |
| 6,334,960 B1* | 1/2002 | Willson et al. | 216/52 |
| 6,348,999 B1* | 2/2002 | Summersgill et al. | 359/569 |
| 6,355,198 B1* | 3/2002 | Kim et al. | 264/259 |
| 6,383,888 B1* | 5/2002 | Stirton | 438/401 |
| 6,387,787 B1* | 5/2002 | Mancini et al. | 438/586 |
| 6,388,755 B1* | 5/2002 | Zhao et al. | 356/614 |
| 6,391,217 B2* | 5/2002 | Schaffer et al. | 216/41 |
| 6,399,406 B2* | 6/2002 | Chan et al. | 438/28 |
| 6,420,892 B1* | 7/2002 | Krivy et al. | 324/750.02 |
| 6,446,933 B1* | 9/2002 | Westmoreland | 249/114.1 |
| 6,482,742 B1* | 11/2002 | Chou | 438/690 |
| 6,489,068 B1* | 12/2002 | Kye | 430/22 |
| 6,498,640 B1* | 12/2002 | Ziger | 355/53 |
| 6,517,977 B2* | 2/2003 | Resnick et al. | 430/5 |
| 6,517,995 B1* | 2/2003 | Jacobson et al. | 430/320 |
| 6,518,189 B1* | 2/2003 | Chou | 438/706 |
| 6,522,411 B1* | 2/2003 | Moon et al. | 356/505 |
| 6,561,706 B2* | 5/2003 | Singh et al. | 396/611 |
| 6,575,676 B2* | 6/2003 | Wang et al. | 409/201 |
| 6,580,172 B2* | 6/2003 | Mancini et al. | 257/762 |
| 6,580,505 B1* | 6/2003 | Bareket | 356/401 |
| 6,603,538 B1* | 8/2003 | Oluseyi et al. | 356/72 |
| 6,605,849 B1* | 8/2003 | Lutwak et al. | 257/415 |
| 6,607,173 B2* | 8/2003 | Westmoreland | 249/114.1 |
| 6,621,960 B2* | 9/2003 | Wang et al. | 385/37 |
| 6,630,410 B2* | 10/2003 | Trapp et al. | 438/723 |
| 6,633,391 B1* | 10/2003 | Oluseyi et al. | 356/630 |
| 6,636,311 B1* | 10/2003 | Ina et al. | 356/401 |
| 6,646,662 B1* | 11/2003 | Nebashi et al. | 346/140.1 |
| 6,664,026 B2* | 12/2003 | Nguyen et al. | 430/311 |
| 6,665,119 B1* | 12/2003 | Kurtz et al. | 359/484.08 |
| 6,678,038 B2* | 1/2004 | Binnard | 355/72 |
| 6,696,220 B2* | 2/2004 | Bailey et al. | 425/385 |
| 6,713,238 B1* | 3/2004 | Chou et al. | 430/322 |
| 6,716,754 B2* | 4/2004 | Hofmann | 438/690 |
| 6,743,368 B2* | 6/2004 | Lee | 216/2 |
| 6,746,319 B2* | 6/2004 | Tada et al. | 451/285 |
| 6,753,131 B1* | 6/2004 | Rogers et al. | 430/322 |
| 6,753,972 B1* | 6/2004 | Hirose et al. | 356/630 |
| 6,770,852 B1* | 8/2004 | Steger | 219/390 |
| 6,771,374 B1* | 8/2004 | Rangarajan et al. | 356/445 |

| Patent/Publication | Date | Inventor | Class |
|---|---|---|---|
| 6,776,094 B1* | 8/2004 | Whitesides et al. | 101/327 |
| 6,780,001 B2* | 8/2004 | Eldridge et al. | 425/385 |
| 6,791,669 B2* | 9/2004 | Poon | 355/72 |
| 6,808,344 B2* | 10/2004 | Chen | 409/201 |
| 6,808,646 B1* | 10/2004 | Jeans | 216/54 |
| 6,809,356 B2* | 10/2004 | Chou | 257/225 |
| 6,819,426 B2* | 11/2004 | Sezginer et al. | 356/401 |
| 6,828,244 B2* | 12/2004 | Chou | 438/706 |
| 6,842,229 B2* | 1/2005 | Sreenivasan et al. | 355/75 |
| 6,849,558 B2* | 2/2005 | Schaper | 438/758 |
| 6,852,358 B1* | 2/2005 | Chen et al. | 427/163.2 |
| 6,852,454 B2* | 2/2005 | Mancini et al. | 430/5 |
| 6,871,558 B2* | 3/2005 | Choi et al. | 73/865.8 |
| 6,873,087 B1* | 3/2005 | Choi et al. | 310/323.17 |
| 6,878,985 B2* | 4/2005 | Arai et al. | 257/315 |
| 6,890,688 B2* | 5/2005 | Mancini et al. | 430/5 |
| 6,900,881 B2* | 5/2005 | Sreenivasan et al. | 355/72 |
| 6,902,853 B2* | 6/2005 | Sreenivasan et al. | 430/22 |
| 6,908,861 B2* | 6/2005 | Sreenivasan et al. | 438/694 |
| 6,916,584 B2* | 7/2005 | Sreenivasan et al. | 430/22 |
| 6,916,585 B2* | 7/2005 | Sreenivasan et al. | 430/22 |
| 6,919,152 B2* | 7/2005 | Sreenivasan et al. | 430/30 |
| 6,921,615 B2* | 7/2005 | Sreenivasan et al. | 430/22 |
| 6,922,906 B2* | 8/2005 | Choi et al. | 33/613 |
| 6,929,762 B2* | 8/2005 | Rubin | 264/40.1 |
| 6,932,934 B2* | 8/2005 | Choi et al. | 264/496 |
| 6,946,360 B2* | 9/2005 | Chou | 438/455 |
| 6,954,275 B2* | 10/2005 | Choi et al. | 356/614 |
| 6,955,767 B2* | 10/2005 | Chen | 216/40 |
| 6,964,793 B2* | 11/2005 | Willson et al. | 427/466 |
| 6,986,975 B2* | 1/2006 | Sreenivasan et al. | 430/22 |
| 7,027,156 B2* | 4/2006 | Watts et al. | 356/401 |
| 7,037,639 B2* | 5/2006 | Voisin | 430/316 |
| 7,070,405 B2* | 7/2006 | Sreenivasan et al. | 425/174.4 |
| 7,077,992 B2* | 7/2006 | Sreenivasan et al. | 264/496 |
| 7,098,572 B2* | 8/2006 | Choi et al. | 310/311 |
| 7,117,583 B2* | 10/2006 | Dinan et al. | 29/603.25 |
| 7,122,482 B2* | 10/2006 | Xu et al. | 438/738 |
| 7,128,875 B2* | 10/2006 | Cubicciotti | 422/82.05 |
| 7,136,150 B2* | 11/2006 | Sreenivasan et al. | 355/75 |
| 7,140,861 B2* | 11/2006 | Watts et al. | 425/174.4 |
| 7,179,079 B2* | 2/2007 | Sreenivasan et al. | 425/385 |
| 7,186,483 B2* | 3/2007 | Sreenivasan et al. | 430/22 |
| 7,229,273 B2* | 6/2007 | Bailey et al. | 425/385 |
| 7,279,113 B2* | 10/2007 | Watts et al. | 216/41 |
| 2001/0023042 A1* | 9/2001 | Dirksen et al. | 430/5 |
| 2002/0018190 A1* | 2/2002 | Nogawa et al. | 355/30 |
| 2002/0042027 A1* | 4/2002 | Chou et al. | 430/322 |
| 2002/0069525 A1* | 6/2002 | Hada et al. | 29/834 |
| 2002/0093122 A1* | 7/2002 | Choi et al. | 264/401 |
| 2002/0122993 A1* | 9/2002 | Katakura | 430/5 |
| 2002/0132482 A1* | 9/2002 | Chou | 438/692 |
| 2002/0135099 A1* | 9/2002 | Robinson et al. | 264/236 |
| 2002/0150398 A1* | 10/2002 | Choi et al. | 396/428 |
| 2002/0159918 A1* | 10/2002 | Tseng et al. | 422/100 |
| 2002/0167117 A1* | 11/2002 | Chou | 264/338 |
| 2002/0170880 A1* | 11/2002 | Chen | 216/52 |
| 2002/0175298 A1* | 11/2002 | Moniwa et al. | 250/492.22 |
| 2002/0177319 A1* | 11/2002 | Chou | 438/690 |
| 2003/0025895 A1* | 2/2003 | Binnard | 355/72 |
| 2003/0034329 A1* | 2/2003 | Chou | 216/44 |
| 2003/0062334 A1* | 4/2003 | Lee et al. | 216/37 |
| 2003/0080471 A1* | 5/2003 | Chou | 264/338 |
| 2003/0080472 A1* | 5/2003 | Chou | 264/338 |
| 2003/0081193 A1* | 5/2003 | White et al. | 355/72 |
| 2003/0092261 A1* | 5/2003 | Kondo et al. | 438/638 |
| 2003/0112421 A1* | 6/2003 | Smith | 355/71 |
| 2003/0113638 A1* | 6/2003 | Mancini et al. | 430/5 |
| 2003/0133126 A1* | 7/2003 | Sarfaty et al. | 356/503 |
| 2003/0137494 A1* | 7/2003 | Tulbert | 345/173 |
| 2003/0174435 A1* | 9/2003 | Dinan et al. | 360/97.01 |
| 2003/0179354 A1* | 9/2003 | Araki et al. | 355/53 |
| 2003/0180631 A1* | 9/2003 | Shiota et al. | 430/5 |
| 2003/0186140 A1* | 10/2003 | Fries | 430/22 |
| 2003/0205657 A1* | 11/2003 | Voisin | 249/187.1 |
| 2003/0205658 A1* | 11/2003 | Voisin | 249/187.1 |
| 2003/0224262 A1* | 12/2003 | Lof et al. | 430/22 |
| 2003/0232252 A1* | 12/2003 | Mancini et al. | 430/5 |
| 2004/0007799 A1* | 1/2004 | Choi et al. | 264/494 |
| 2004/0008334 A1* | 1/2004 | Sreenivasan et al. | 355/72 |
| 2004/0009673 A1* | 1/2004 | Sreenivasan et al. | 438/694 |
| 2004/0021254 A1* | 2/2004 | Sreenivasan et al. | 264/494 |
| 2004/0021866 A1* | 2/2004 | Watts et al. | 356/401 |
| 2004/0022888 A1* | 2/2004 | Sreenivasan et al. | 425/174.4 |
| 2004/0033515 A1* | 2/2004 | Cao et al. | 435/6 |
| 2004/0036201 A1* | 2/2004 | Chou et al. | 264/402 |
| 2004/0046288 A1* | 3/2004 | Chou | 264/479 |
| 2004/0110856 A1* | 6/2004 | Young et al. | 522/6 |
| 2004/0112861 A1* | 6/2004 | Choi et al. | 216/66 |
| 2004/0118809 A1* | 6/2004 | Chou et al. | 216/40 |
| 2004/0124566 A1* | 7/2004 | Sreenivasan et al. | 264/494 |
| 2004/0131718 A1* | 7/2004 | Chou et al. | 425/385 |
| 2004/0137734 A1* | 7/2004 | Chou et al. | 438/689 |
| 2004/0141163 A1* | 7/2004 | Bailey et al. | 355/18 |
| 2004/0146792 A1* | 7/2004 | Nimmakayala et al. | 430/22 |
| 2004/0150129 A1* | 8/2004 | Hougham et al. | 264/85 |
| 2004/0156108 A1* | 8/2004 | Chou et al. | 359/566 |
| 2004/0163563 A1* | 8/2004 | Sreenivasan et al. | 101/494 |
| 2004/0168586 A1* | 9/2004 | Bailey et al. | 101/3.1 |
| 2004/0189994 A1* | 9/2004 | Sreenivasan et al. | 356/399 |
| 2004/0189996 A1* | 9/2004 | Sreenivasan et al. | 356/401 |
| 2004/0192041 A1* | 9/2004 | Jeong et al. | 438/689 |
| 2004/0197843 A1* | 10/2004 | Chou et al. | 435/7.92 |
| 2004/0202865 A1* | 10/2004 | Homola et al. | 428/421 |
| 2004/0209177 A1* | 10/2004 | Sreenivasan et al. | 430/22 |
| 2004/0219246 A1* | 11/2004 | Jeans | 425/174.4 |
| 2004/0223131 A1* | 11/2004 | Choi et al. | 355/72 |
| 2004/0223883 A1* | 11/2004 | Choi et al. | 422/82.05 |
| 2004/0250945 A1* | 12/2004 | Zheng et al. | 156/230 |
| 2005/0006343 A1* | 1/2005 | Choi et al. | 216/59 |
| 2005/0028618 A1* | 2/2005 | Chol et al. | 73/865.9 |
| 2005/0037143 A1* | 2/2005 | Chou et al. | 427/248.1 |
| 2005/0051698 A1* | 3/2005 | Sreenivasan et al. | 249/135 |
| 2005/0051742 A1* | 3/2005 | Shiraishi | 250/548 |
| 2005/0064304 A1* | 3/2005 | Bailey et al. | 430/320 |
| 2005/0067379 A1* | 3/2005 | Sreenivasan et al. | 216/44 |
| 2005/0084804 A1* | 4/2005 | Truskett et al. | 430/311 |
| 2005/0098534 A1* | 5/2005 | Sreenivasan et al. | 216/52 |
| 2005/0100830 A1* | 5/2005 | Xu et al. | 430/322 |
| 2005/0158637 A1* | 7/2005 | Kim et al. | 430/5 |
| 2005/0184436 A1* | 8/2005 | Jeong et al. | 264/496 |
| 2005/0230882 A1* | 10/2005 | Watts et al. | 264/496 |
| 2005/0271955 A1* | 12/2005 | Cherala et al. | 430/22 |
| 2005/0274219 A1* | 12/2005 | Choi et al. | 74/490.07 |
| 2005/0275251 A1* | 12/2005 | Choi et al. | 297/40 |
| 2005/0275311 A1* | 12/2005 | Choi et al. | 310/323.05 |
| 2006/0005657 A1* | 1/2006 | Choi et al. | 74/490.07 |
| 2006/0032437 A1* | 2/2006 | McMackin et al. | 118/100 |
| 2006/0062867 A1* | 3/2006 | Choi et al. | 425/174.4 |
| 2006/0076717 A1* | 4/2006 | Sreenivasan et al. | 264/494 |
| 2006/0077374 A1* | 4/2006 | Sreenivasan et al. | 355/72 |
| 2006/0114450 A1* | 6/2006 | Nimmakayala et al. | 356/139.04 |
| 2006/0115999 A1* | 6/2006 | Sreenivasan et al. | 438/780 |
| 2006/0126058 A1* | 6/2006 | Nimmakayala et al. | 356/139.04 |
| 2006/0158651 A1* | 7/2006 | Watts et al. | 356/401 |
| 2006/0172031 A1* | 8/2006 | Babbs et al. | 425/385 |
| 2006/0177535 A1* | 8/2006 | McMackin et al. | 425/385 |
| 2006/0266916 A1* | 11/2006 | Miller et al. | 249/134 |
| 2007/0026542 A1* | 2/2007 | Sreenivasan et al. | 438/10 |
| 2007/0122942 A1* | 5/2007 | Sreenivasan et al. | 438/118 |

* cited by examiner

IMPRINT ALIGNMENT METHOD, SYSTEM AND TEMPLATE

CROSS-REFERENCE TO RELATED APPLICATION

The present application is a continuation of U.S. patent application Ser. No. 10/895,214 filed Jul. 20, 2004, now issued as U.S. Pat. No. 7,785,526, which is incorporated herein by reference.

BACKGROUND OF THE INVENTION

The present invention relates to a method of improving imprint lithography alignment as well as a system and template to be used for same. The method, system, and template herein described have particular utility in subfield alignment of sub 100 nm features requiring registration of about 25 nm.

Micro-fabrication involves the fabrication of very small structures, e.g., having features on the order of micrometers or smaller. One industry that has been driving the fabrication of increasingly smaller structures is the electronics industry. As electronic devices have become smaller and faster, the integrated circuits that drive them have necessarily become smaller.

A technique known as 'photolithography', or simply 'lithography', is typically employed in the manufacture of integrated circuits. Lithographic techniques are generally used to pattern the various levels of an integrated circuit. Typically, these lithographic techniques include applying a photosensitive material to a semiconductor substrate. These photosensitive materials, commonly referred to as "resist," are selectively exposed to a form of radiation. An exposure tool and photomask are often used to obtain the desired selective exposure. Such exposure changes the solubility of the resist such that the photomask's pattern is formed in the resist following a development process to remove the soluble resist. The resulting patterned resist serves to protect underlying conductive or dielectric material from etching or ion implantation.

It is critical to align successive layers of an integrated circuit to each other to ensure proper operation of the circuit. In particular, the photomask pattern must be properly aligned to previously formed semiconductor topography features during the lithography process. In the extreme, lithographic misalignment may lead to shorting between structures that should be isolated from each other, and isolation of structures that should be coupled to each other.

Imprint lithography is capable of manufacturably producing sub-100 nm features. Several imprint lithography techniques have been investigated as low cost, high volume manufacturing alternatives to conventional photolithography for high-resolution patterning. In this emergent technology, a relief image in a template is used to replicate a surface relief into a polymerizable material arranged upon the surface of a substrate. The template makes mechanical contact with the material arranged upon the substrate, and the material is subjected to conditions to solidify and/or to polymerize the same such that a relief structure complimentary to that of the template is formed on the substrate. The material may be solidified or polymerized by, for example, heat or actinic light. Such patterning and polymerization techniques may be referred to as thermal imprint lithography or ultraviolet ('UV') imprint lithography, respectively. Typical substrates may include semiconductors, dielectric materials, magnetic materials, or optoelectronic materials.

Imprint lithography may be used in wide variety of applications. That is, imprint lithography applications are not limited to the manufacture of integrated circuits. However, typical applications require alignment of subsequently imprinted device layers to previously imprinted device layers. Properly aligning subsequent imprint lithography device layers becomes increasingly difficult as feature sizes become ever smaller. Imprint lithography systems are currently capable of printing features in the sub-100 nm range with a 3σ overlay alignment capability of less than about 500 nm. Despite a high degree of alignment accuracy, current imprint lithography systems are challenged by the degree of precision required to consistently align multiple layers having minimum feature sizes. Devices having such minimum feature sizes may also have registration tolerances of about 25 nm or less. Consequently, proper alignment of multi-layered devices having minimum feature sizes may be a relatively infrequent event. It is desired, therefore, to provide improvement to imprint lithography alignment.

SUMMARY OF THE INVENTION

Presented herein is an improved alignment method with particular utility in imprint lithography applications. In an embodiment, the method of improving lithographic alignment essentially comprises imprinting a first layer on a substrate and imprinting a second layer on the first layer, the first layer including an array of first-layer geometries each arranged within a respective subfield with each first-layer geometry including at least one first-layer feature, and the second layer including an array of second-layer geometries each arranged within a respective subfield with each second-layer geometry including at least one second-layer feature, where at least one second-layer feature has at least one corresponding first-layer feature, where at least one second-layer geometry has a corresponding first-layer geometry, and where at least one second-layer geometry is intentionally offset from its corresponding first-layer geometry. In an embodiment, at least two second-layer geometries are intentionally offset from their corresponding first layer geometries, and said offsets are not equal.

Also in an embodiment, the present invention essentially comprises a method of improving lithographic alignment between subsequent imprinted device layers within a subfield. Such a method includes establishing an (x,y) grid whereby a centermost point of a subfield arranged within a central region has (x,y) coordinates (0,0). Such a method further includes establishing an array having 'N' subfields arranged in 'J' rows and 'K' columns, where each column has a width 'w' and each row has a height 'h', and a device is arranged entirely within a single subfield. The method further includes imprinting a first layer having an array of 'N' first-layer geometries, where a centermost point of a central first-layer geometry has (x,y) coordinates (0,0), where a centermost point of each first-layer geometry is commensurate with a centermost point of its respective subfield, where a centermost point of a first-layer geometry is a spaced distance 'w' from a centermost point of an immediately laterally adjacent first-layer geometry, and where a centermost point of a first-layer geometry is a spaced distance 'h' from a centermost point of an immediately vertically adjacent first-layer geometry. The method further includes imprinting a second layer, where the second layer includes an array of 'N' second-layer geometries, where each second-layer geometry has a corresponding first-layer geometry, where a centermost point of a central second-layer geometry has (x,y) coordinates (0,0), where a centermost point of a second-layer geometry is a spaced distance 'w+Δw' from a centermost point of an immediately laterally adjacent second-layer geometry and a centermost point of a second-layer geometry is a spaced distance 'h+Δh' from a centermost point of an immediately vertically adjacent first-layer geometry, where Δw and Δh are both non-zero.

Also in an embodiment, the present invention essentially comprises a set of lithography templates providing improved lithographic alignment. Such a template set includes a first template having an array of first geometries and a second template having an array of second geometries, where each second geometry has a corresponding first geometry, and where at least one second geometry is intentionally offset from its corresponding first geometry.

These and other embodiments are herein described.

BRIEF DESCRIPTION OF THE DRAWINGS

The same reference numerals refer to the same parts throughout the various figures.

DETAILED DESCRIPTION OF THE INVENTION

Although an imprint lithography system may have a high degree of alignment accuracy, the alignment precision may not suffice for multi-layered devices having sub 100 nm features. Using typical lithography methods, systems, and devices, a system having a three sigma alignment accuracy of less than about 500 nm may not be sufficient to produce functional, multi-layered devices having, for example, registration tolerances of about 25 nm or less, and having minimum feature sizes of, for example, about 50 nm or less. An exemplary lithographic system is available under the trade name IMPRIO® 100 from Molecular Imprints, Inc. having a place of business at 1807 Braker Lane, Bldg. C-100, Austin, Tex. 78758. The system description for the IMPRIO® 100 is available at www.molecularimprints.com and is incorporated herein by reference.

Typically all the layers within a respective print field are replicated substantially identically, resulting in substantially identical devices within each print field. This strategy is useful when producing devices which have design tolerances well within the capabilities of the lithography system, or systems, used. In such cases, successful device production may be defined by a high yield of functional devices. However, the instant invention is intended to aid in producing leading-edge devices that have design tolerances which test the capabilities of the best lithography systems now available. In the manufacture of such leading-edge devices, success may be defined as producing as few as a single functional device on an entire wafer. Where design tolerances such as alignment or registration test the limits of a lithography system, success may be attained by deliberately offsetting device features. That is, it may be desirable to deliberately offset features of an imprinted image within an individual subfield as described below.

Figure 1:
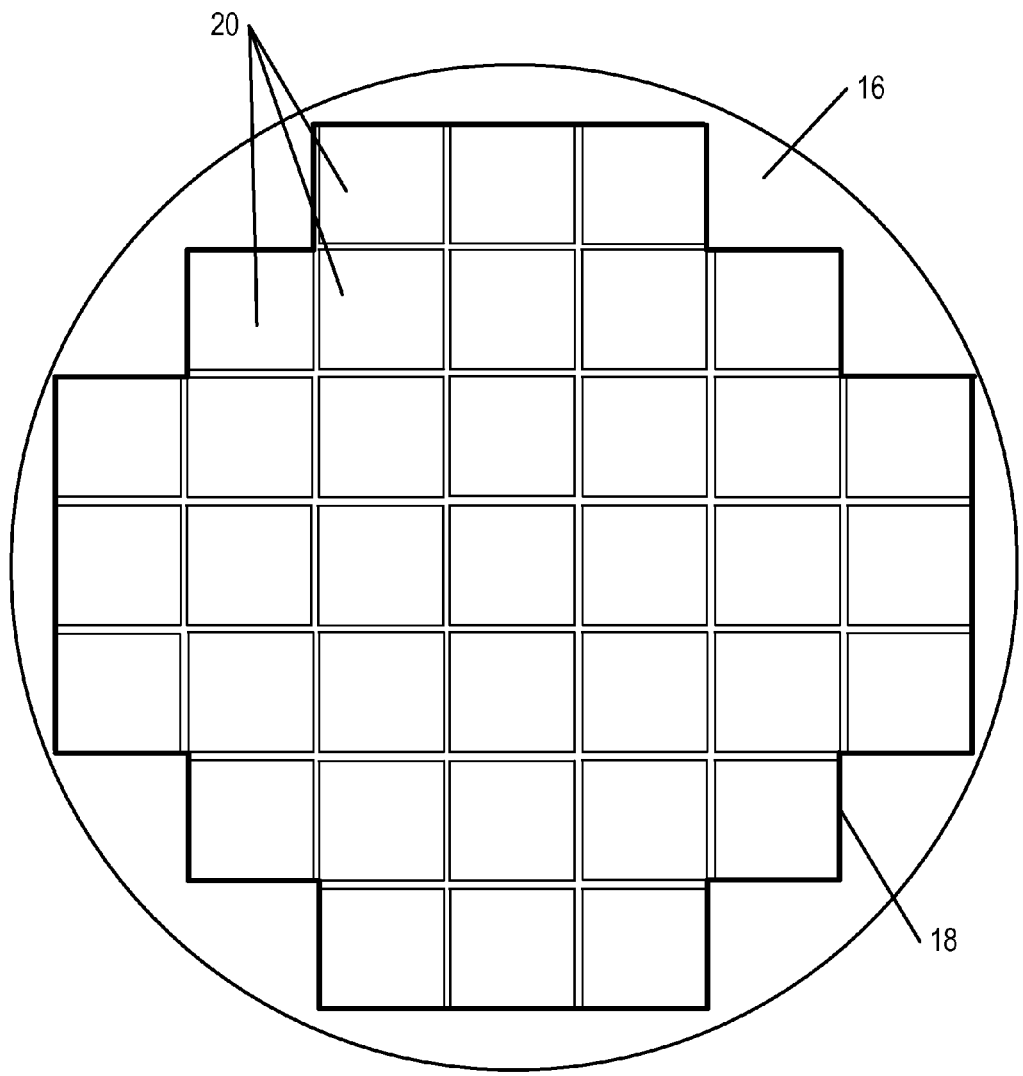
FIG. 1 is a plan view of a wafer substrate illustrating the wafer field and the print fields which comprise the wafer field.

FIG. 1 illustrates substrate 16, which in this case is a semiconductor wafer. Upon substrate 16, a wafer field 18, comprising print fields 20, is defined. Typically, a wafer field 18 is comprised of an integral number of print fields 20. The dimensions of a print field may be as large as a lithography system's maximum field. An imprint lithography system' maximum field is the largest area the system can simultaneously imprint. That is, the maximum area that can be imprinted with one flash. In an embodiment, the maximum field size of an imprint lithography system is 25 mm×25 mm. An optical lithography system's maximum field is the largest area the system can expose in one exposure. A wide variation of maximum optical lithography field sizes exist, ranging from about 25 mm×33 mm to about 800 mm×920 mm. Although the instant invention is directed toward an imprint lithography system, the methods, systems, and templates described herein may also be applicable to at least some optical lithography systems.

Figure 2:
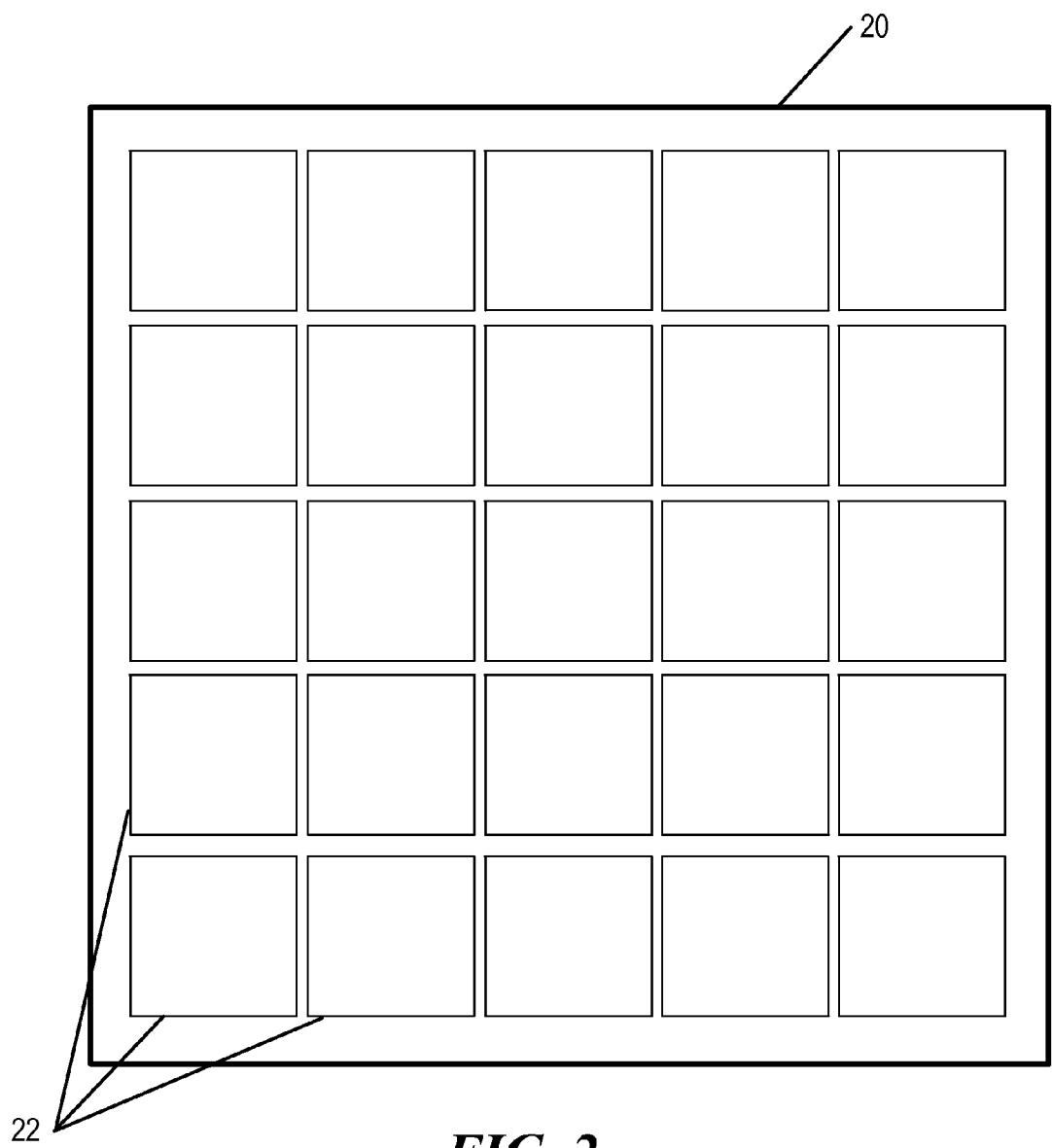
FIG. 2 is a plan view of a print field having multiple subfields.

FIG. 2 illustrates a print field 20 having multiple subfields 22. Typically, a print field is comprised of an integral number of subfields. Subfields 22 are shown a spaced distance from the perimeter of the print field 20 merely for clarification. Similarly, the subfields 22 are shown a spaced distance from one another merely for clarification. In an embodiment, subfields 22 may abut one another. Each subfield may accommodate one or more devices. The devices may or may not have similar geometries, features, and/or functions.

A first-layer geometry is created within each subfield 22. The first layer geometry includes first-layer features for one or more devices which may or may not be similar. The first layer features may have minimum feature sizes in the range of, for example, 100 nm or smaller. Each first-layer geometry is arranged such that its features are arranged entirely within its respective subfield 22. In the embodiment shown, the first layer geometry has a centermost point which is substantially commensurate with the centermost point of the subfield. Thus, in an embodiment, each first-layer geometry is similarly arranged within its corresponding subfield. Such arrangement is in contrast to the second-layer geometries to be discussed below.

Figure 3:
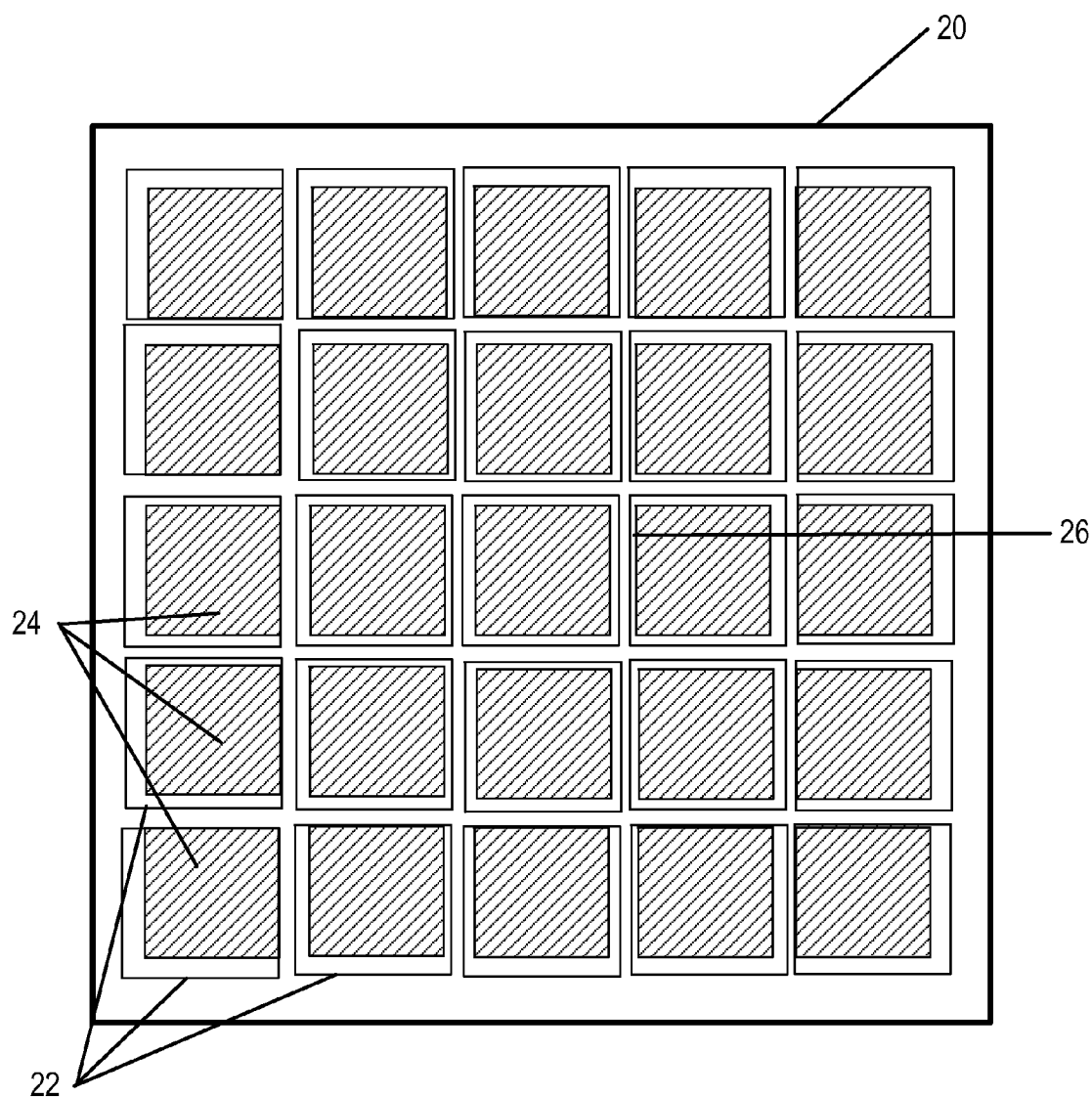
FIG. 3 is a plan view of a print field having first and second-layer geometries imprinted thereupon.

FIG. 3 illustrates the print field 20 having second-layer geometries 24 imprinted upon first-layer geometries. Each second-layer geometry is comprised of second-layer features, where at least one second-layer feature has a corresponding first-layer feature to which proper alignment is required for proper device operation. Typically, a second-layer geometry will occupy the same approximate area as its corresponding first-layer geometry. Therefore, it is noted that first-layer geometries do not necessarily extend to the perimeter of their respective subfields, as second-layer geometries may be printed entirely within their respective subfields. As used herein, first-layer or second-layer geometries may not necessarily include sacrificial diagnostic features. Such features may be created within the print field yet outside the subfields.

As shown, no two second-layer geometries are similarly arranged within their respective subfields. A centermost second-layer geometry 26 has a centermost point which is substantially commensurate with that of its respective subfield. However, each other second-layer geometry's centermost point is offset from that of its respective subfield. Further, each offset second-layer geometry has a unique offset. In an embodiment, each offset with respect to a centermost point of the subfield may be a multiple of about 25 nm. In this case, the offset multiple is therefore 25 nm. The offset multiple is a function of the capability of the lithography template-making process, system, and apparatus(es). Consequently, as template manufacturing improves, offset multiples may shrink accordingly.

Figure 4:
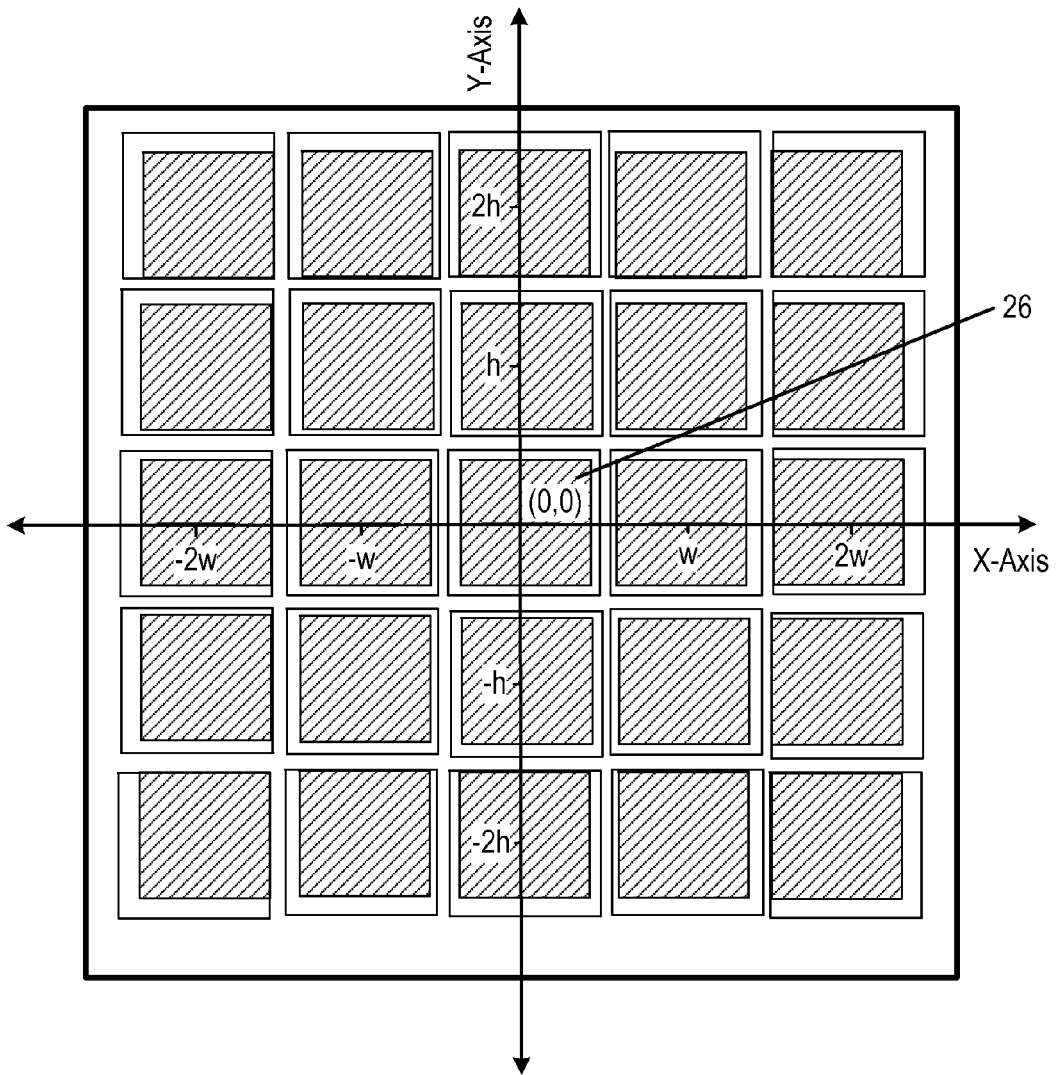
FIG. 4 is a plan view of the print field of FIG. 4 imposed upon x and y axes.

FIG. 4 illustrates the arrangement of the first-layer geometries and second-layer geometries with the aid of an (x,y) axis. Central second-layer geometry 26 is arranged such that its centermost point is substantially commensurate with the origin of the axis, (0,0). The subfields are arranged in an array having 'J' rows and 'K' columns. In this case, J=K=5. However, it is not required that J=K. Each column has a width 'w' and each row has a height 'h'. In this embodiment, the first-layer geometries are spaced commensurate with the subfields. Thus, the first layer geometries are not offset with respect to their respective subfields. Therefore, a center of any first-layer geometry is a horizontal distance of 'w' or a vertical distance of 'h' from any immediately laterally adjacent first-layer geometry. In the embodiment shown, 'w' equals 'h', and the centers of the first-layer geometries are equally spaced one from the next.

Figure 5:
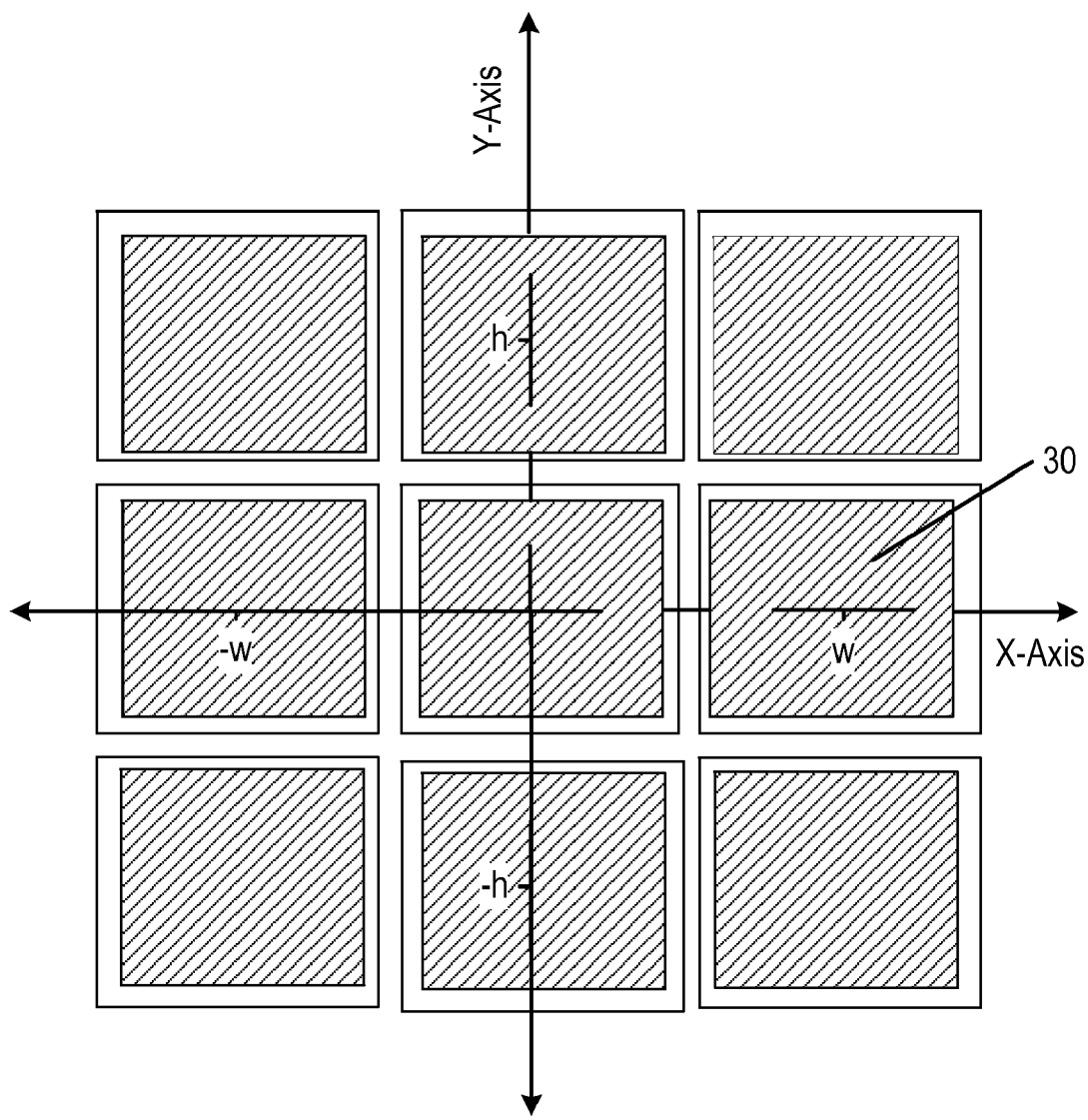
FIG. 5 is a more detailed view of FIG. 5.

As more clearly illustrated by FIG. 5, the centers of the second-layer geometries are also equally spaced. However, the spacing of the second-layer geometries are not equal to the spacing of the first-layer geometries. The columns of the second-layer geometries have a width 'w+$\Delta$w', and the rows have a height 'h+$\Delta$h'. It is noted that the offset multiples, $\Delta$w and $\Delta$h, may be any non-zero number. For example, the offset multiples shown in FIG. 5 are negative. In an embodiment, a centermost subfield is imprinted with geometries having no offset with respect to the centermost subfield, and geometries imprinted on remaining subfields have (x,y) offsets equivalent to the product of the respective offset multiples, ($\Delta$w,$\Delta$h), and the number of rows and columns from the centermost subfield. As an example, second-layer geometry 30 is one column, zero rows from the centermost subfield. Hence, the offset of second-layer geometry 30 is ($\Delta$w,0).

While preferred embodiments of the instant invention have been described in detail, it should be apparent that modifications and variations thereto are possible, all of which fall within the true spirit and scope of the invention. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention. As described above, a single wafer substrate is contemplated. However, it is recognized that the invention herein described may be employed with any number of lithography applications.

Additionally, although the designations first-layer and second-layer are used, it is understood that the terminology is not intended to be limiting. That is, although in an embodiment the first-layer may precede the second-layer, the first-layer does not necessarily immediately precede the second layer. Further, in an embodiment, the described second-layer having at least one offset second-layer geometry may actually precede the first-layer geometry having no offset geometries. That is, a layer having offsets with respect to the subfields may be printed prior to a layer having no such offsets. Further, both layers may have offsets. That is, there may be no layer having no offset geometries with respect to the respective subfields. Furthermore, the instant invention is not limited to 2 layers. Three or more layers may be employed without deviating from the intents and purposes of the instant invention. Consequently, a subfield may itself be comprised of subfields, or sub-subfields. Such sub-subfields may or may not comprise entire devices.

Further, the number of subfields which comprise a print field may not be constant, even within a single wafer. Maximum print field size is lithography system dependent. Therefore, the print field size may vary within a single wafer in those cases where processing is performed by multiple lithographic systems, each having a distinct print field size. Thus, the print field size may vary from one processing layer to another. Each print field may be comprised of multiple subfields, where each subfield accommodates one or more devices, and each subfield may be comprised multiple sub-subfields which may or may not accommodate whole devices and which may or may not include offset geometries.

However, whole print fields typically have an integral number of devices. Yet, partial print fields may be imprinted or patterned by the lithography system, particularly around a perimeter of the substrate. It is possible for a partial print field to produce yielding devices in those instances where a print field accommodates multiple devices. In the instances where a print field accommodates only a single device, partial print fields may also be imaged or patterned although no possibility of a yielding device exists. For example, such wafer edge processing may be advantageous in terms of, for example, layer uniformity and wafer planarity.

Although improving alignment registration for features less than about 100 nm has been described, it should be appreciated that the invention herein described is also suitable for improving alignment registration for any size features as may be required in the fabrication of, for example, an integrated circuit. Thus, as patterning resolution improves, the methods, systems, and templates described herein may continue to aid in improve lithographic alignment. Further, applications for the instant invention may exist in the manufacture of devices having features much larger than about 100 nm.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A set of lithography templates providing improved lithographic alignment comprising:
   a first template having an x,y grid such that a centermost point is arranged within a central region and has (x,y) coordinates (0,0), the first template includes an array of first geometries comprising N subfields arranged in J rows and K columns, wherein each column has a width 'w', and wherein each row has a height 'h';
   a second template having an array of second-layer geometries, each second geometry corresponding to a first geometry, wherein a centermost point of a second geometry is a spaced distance 'w+$\Delta$w' from a centermost point of an immediately laterally adjacent second geometry, and wherein a centermost point of a second geometry is a spaced distance 'h+$\Delta$h' from a centermost point of an immediately vertically adjacent second geometry, wherein $\Delta$w is not equal to zero, and wherein $\Delta$h is not equal to zero.

2. The set of lithography templates as recited in claim 1, wherein $\Delta$h equals $\Delta$w.

3. The set of lithography templates as recited in claim 1, wherein 'h' equals 'w'.

4. The set of lithography templates as recited in claim 1, wherein at least one second geometry is not offset from its corresponding first geometry.

5. The set of lithography templates as recited in claim 1, wherein each second geometry comprises second features, further comprising a third template, wherein the third template comprises an array of third geometries, wherein each third geometry comprises third features, and wherein at least one of said third features has a corresponding second feature, and wherein at least one third feature is offset from its corresponding second feature.

6. The set of lithography templates as recited in claim 1, further comprising an 'n'th template, wherein 'n' is an integer greater than or equal to 3, wherein the 'n'th template comprises an array of 'n'th geometries, wherein each 'n'th geometry comprises 'n'th features, wherein at least one of said 'n'th feature has a corresponding 'n−1'th geometry, and wherein at least one 'n'th feature is offset from its corresponding 'n−1'th feature.

* * * * *